United States Patent [19]

Shen et al.

[11] Patent Number: 5,449,922

[45] Date of Patent: Sep. 12, 1995

[54] BIPOLAR HETEROJUNCTION DIODE

[75] Inventors: Jun Shen, Phoenix; Herbert Goronkin, Tempe; Saied N. Tehrani, Scottsdale, all of Ariz.

[73] Assignee: Motorola, Schaumburg, Ill.

[21] Appl. No.: 237,574

[22] Filed: May 3, 1994

[51] Int. Cl.⁶ ............... H01L 29/205; H01L 29/88
[52] U.S. Cl. ......................... 257/25; 257/12; 257/22; 257/198; 257/201
[58] Field of Search ............ 257/25, 22, 198, 12, 257/201

[56] References Cited

FOREIGN PATENT DOCUMENTS 62-209864  9/1987  Japan .................................. 257/25

OTHER PUBLICATIONS

Zhu et al *Solid State Comm.* vol. 75 No. 7 pp. 595-599 1990 "Excitonic in Structure".
MacDonald et al., Well Width Dependence of Tunneling Current in Double-Quantum-Well Resonant Interband Tunnel Diodes, IEEE Electron Device Letters, vol. 13, No. 3, Mar. 1992, pp. 155-157.
Day et al., Double Quantum Well Resonant Tunnel Diodes, Appl. Phys. Lett. 57 (12), 17 Sep. 1990, pp. 1260-1261.

*Primary Examiner*—Jerome Jackson
*Attorney, Agent, or Firm*—Robert F. Hightower

[57] ABSTRACT

A bipolar heterojunction diode has an anode (11, 41), a blocking layer (12, 42) and a junction region (13, 14, 43). a heterojunction (32, 58) in the junction region (13, 14, 43) is utilized to create a misalignment between the band gap of the anode (11, 41) and a band gap of the heterojunction (13, 14, 43). The misalignment prevents a depletion region from extending into the heterojunction (13, 14, 43).

11 Claims, 1 Drawing Sheet

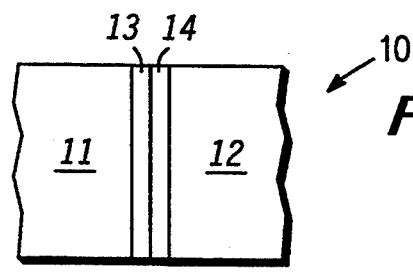
FIG. 1
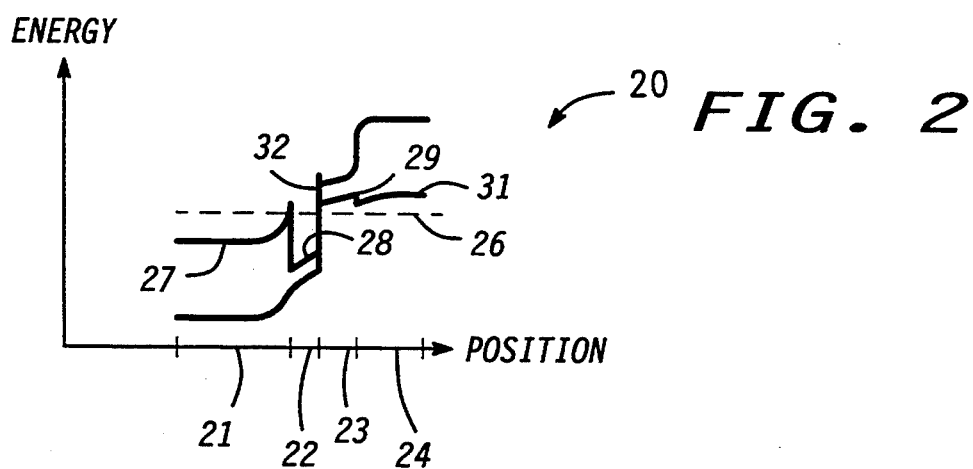
FIG. 2
FIG. 3
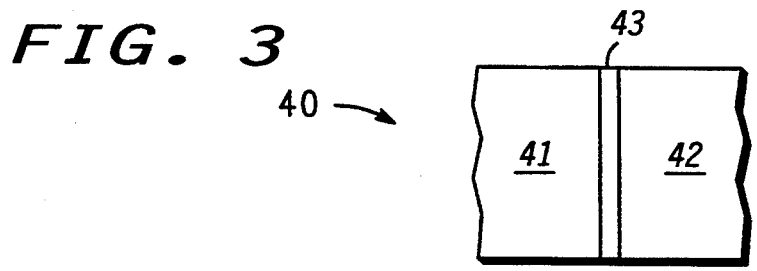
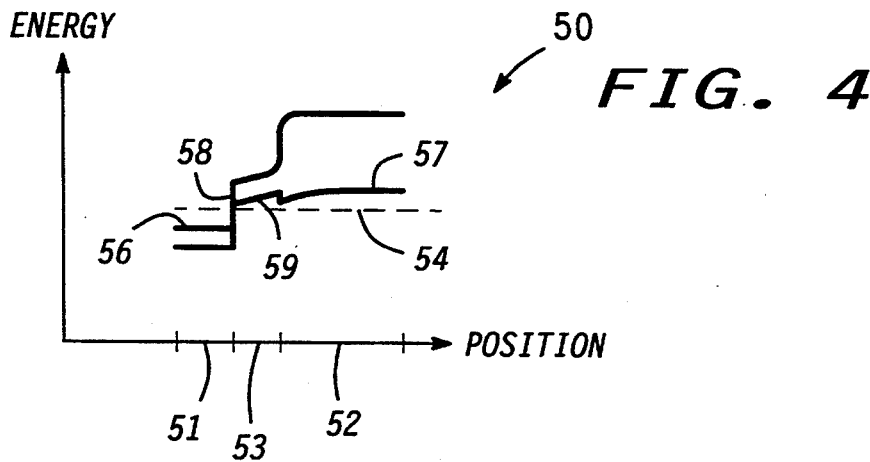
FIG. 4

BIPOLAR HETEROJUNCTION DIODE

BACKGROUND OF THE INVENTION

The present invention relates, in general, to semiconductor devices, and more particularly, to a novel semiconductor diode.

In the past, the semiconductor industry has utilized quantum well and multiple quantum well structures to form semiconductor diodes. One problem with these prior devices is the ratio between the maximum or peak current to the minimum or valley current, often referred to as the peak-to-valley current ratio. One particular implementation positions a quantum well within the conduction or junction region of the diode in order to provide a conduction path through a depletion region that is formed in the conduction region. The depletion region forms a potential barrier that limits current flow through the conduction region. Consequently, the quantum well may provide some increase in the peak current, but it has little or no effect on the valley current. Prior diodes generally have a peak-to-valley current ratio that is less than approximately 100:1.

In digital applications, the peak current is utilized to represent one digital state and the valley current represents the other state. To ensure reliable detection of each digital state, it is important to have a high, greater than 100:1, peak-to-valley current ratio.

Accordingly, it is desirable to have a diode having a peak-to-valley ratio greater than approximately 100:1, and having a conduction or junction region that is devoid of a depletion region.

BRIEF DESCRIPTION OF THE DRAWINGS

FIG. 1 illustrates an enlarged cross-sectional portion of a diode in accordance with the present invention;

FIG. 2 is a graph illustrating energy levels in the diode of FIG. 1 in accordance with the present invention;

FIG. 3 illustrates an enlarged cross-sectional portion of an alternate embodiment of a diode in accordance with the present invention; and FIG. 4 is a graph illustrating the energy levels in the diode of FIG. 3 in accordance with the present invention.

DETAILED DESCRIPTION OF THE DRAWINGS

FIG. 1 illustrates an enlarged cross-sectional portion of a diode 10 that has a high peak-to-valley current ratio. Diode 10 includes a cathode or blocking layer 11, an anode 12 and a conduction or junction region that includes a first junction region 13 abutting layer 11, and a second junction region 14 abutting both anode and region 13. Diode 10 is described further, including materials and doping concentrations, in the discussion of FIG. 2.

FIG. 2 is a graph 20 that illustrates electron and hole energy levels in both the conduction and valence bands of diode 10 (FIG. 1). For convenience of explanation, the following description will have references to both FIG. 1 and FIG. 2. The ordinate of graph 20 indicates increasing energy level and the abscissa indicates position within diode 10. Sections of the abscissa indicate corresponding portions of diode 10, for example, section 21 indicates layer 11, section 22 indicates region 13, section 23 indicates region 14, and section 24 indicates anode 12. A fermi level 26 of diode 10 is represented by a dashed line. The upper solid line of graph 20 represents a minimum level of a conduction band of diode 10, while a maximum valence band level is represented by the lower solid line of graph 20. As used herein, maximum means the maximum excursion of the valence band in a particular material, and minimum means the minimum excursion of the conduction band in a particular material.

The peak current of diode 10 depends primarily on the ease with which an electron can tunnel from layer 11 to anode 12, and the availability of electrons in layer 11 and holes in anode 12. Generally, electrons flow from the conduction band of layer 11 into the conduction band of region 13, and then tunnel into the valence band of region 14 thereafter flowing into the valence band of anode 12. It has been found that tunneling into the valence band of region 14 is facilitated by arranging the band gap structure so that the band gap within region 14 is misaligned with the band gap of both region 13 and layer 11. In order to create the misalignment, a heterojunction 32 is formed at the interface of region 13 with region 14. Heterojunction 32 allows the band gap of regions 13 and 14 to be shifted, thus facilitating the misalignment. It has also been found that the misaligned band gap arrangement prevents a depletion region from extending into heterojunction 32. If a depletion region were to extend into the junction region, the depletion region would form a potential barrier that would reduce or prevent tunneling. Additionally, region 14 must also be thin enough to allow electrons to traverse region 14. In the preferred embodiment, region 14 is approximately 10 to 20 nanometers thick.

In order to facilitate the misaligned band gap structure, layer 11 has a conduction band minimum 27 that is below fermi level 26, and region 13 has a conduction band minimum 28 that is less than conduction band minimum 27. Within region 14, diode 10 has a valence band maximum 29 that is not less than conduction band minimum 27 and is greater than a valence band minimum 31 of anode 12. Such a band gap structure ensures that heterojunction 32 is devoid of a depletion region, and increases the peak current of diode 10. It is believed that the misaligned band gap structure provides diode 10 with a peak current at least ten times greater than prior diodes.

The valley current of diode 10 generally is determined by the band gap of the materials in layer 11 and anode 12. The larger the band gap the smaller the valley current. Thus, the materials used for layer 11 and anode 12 generally have a large band gap while the materials used for regions 13 and 14 generally have a small band gap.

In the preferred embodiment, layer 11 utilizes heavily doped N-type aluminum antimonide while layer 12 uses heavily doped P-type aluminum antimonide. Layer 11 has a doping concentration of approximately $1 \times 10^{17}$ to $1 \times 10^{20}$ atoms per cubic centimeter (atom/cm$^3$), and anode 12 has a doping concentration $1 \times 10^{19}$ to $1 \times 10^{20}$ atoms/cm$^3$. This heavy doping ensures that maximum 31 is at least greater than fermi level 26. Also, indium arsenide is used to provide the small band gap within region 13, and gallium antimonide is utilized in region 14 to create heterojunction 32. It should also be noted that indium phosphide can be used for blocking layer 11 and anode 12.

The large band gap in layer 11 and anode 12 is used to block electrons thereby reducing valley current. Under initial bias, electrons flow from the conduction band of layer 11 into the conduction band of region 13, tunnel through heterojunction 32 into the valence band of region 14, and then flow into the valence band of anode 12. As the bias is increased, conduction band minimum 27 is raised to be near fermi level 26 while valence band minimum 31 is pushed downward to also be near fermi level 26. As conduction band minimum 27 increases to be greater than valence band minimum 31, a potential barrier is created that prevents electron flow thereby creating the valley current. Because of the large band gap within layer 11 and anode 12 in addition to the misaligned band gap structure, it is believed that diode 10 has a peak-to-valley current ratio in excess of 150:1 and typically may be higher than 1,000:1.

FIG. 3 illustrates an alternate embodiment of a diode 40 that has a high peak-to-valley current ratio. Diode 40 has a cathode or blocking layer 41, and an anode 42 and a conduction or junction region 43. Diode 40 is described further, including materials and doping concentrations, in the discussion of FIG. 4.

FIG. 4 is a graph 50 that illustrates electron and hole energy levels in both the conduction and valence bands of diode 40 (FIG. 3). For convenience of explanation, the following description will have references to both FIG. 3 and FIG. 4. The ordinate of graph 50 indicates increasing energy level and the abscissa indicates position within diode 40. Sections of the abscissa indicate corresponding portions of diode 40, for example, section 51 indicates layer 41, section 53 indicates region 43, and section 52 indicates anode 42. A fermi level 54 of diode 40 is represented by a dashed line. The upper solid line of graph 50 represents a minimum level of a conduction band of diode 40, and a maximum valence band level is represented by the lower solid line of graph 50. As shown by graph 50, layer 41 has a first conduction band minimum 56 that is less than fermi level 54. The band gaps of layer 41 and region 43 are selected to form a heterojunction, illustrated in graph 50 by a heterojunction 58. As indicated hereinbefore in the discussion of FIG. 2, it is important to have the band gaps of layer 41 and region 43 misaligned so that the depletion region cannot extend from region 41 into heterojunction 58. In order to ensure the misalignment, the band gap of region 43 is formed at a higher energy level than the band gap of layer 41. Consequently, a valence band maximum 59 of region 43 is not less than conduction band minimum 56 of layer 41. Region 43 must also be thin enough for electron to tunnel through. In the preferred embodiment, region 43 is approximately 10 to 20 nanometers thick. As indicated in the discussion of FIG. 2, the valley current generally is determined by the band gap of the materials in layer 41 and anode 42. In order to provide diode 40 with a small valley current, conduction band minimum 56 is below fermi level 54, and anode 42 has both a wide band gap and a valence band maximum 57 that is at least greater than fermi level 54.

A small band gap material is used for layer 41 since it is easier to heavily dope such materials than larger band gap materials. In the preferred embodiment, the material used for layer 41 has a smaller band gap than the material used for region 13. In this preferred embodiment, layer 41 is formed from heavily doped N-type indium arsenide, region 43 is formed from gallium antimonide, and anode 42 is formed from heavily doped P-type aluminum antimonide. The preferred doping of layer 41 is at least $1 \times 10^{18}$ atoms/cm$^3$, and that of anode 42 is at least $1 \times 10^{19}$ atoms/cm$^3$. Although the band gap of the indium arsenide in layer 41 is not as large as the aluminum antimonide band gap of anode 42, the indium arsenide readily accepts the heavy doping.

By now it should be appreciated that there has been provided a novel diode. Ensuring that the depletion region does not extend into the heterojunction, provides the diode with a very high peak current. Utilizing a multilayer junction region facilitates forming the misaligned band gap structure while still having a large band gap within the cathode, thereby providing a high peak-to-valley current ratio. Utilizing a small band gap material for the cathode facilitates heavily doping the cathode to ensure that the band gap in the cathode has a lower energy than the band gap of the heterojunction once again providing a high peak-to-valley current ratio. Such a diode can be referred to as a bipolar heterojunction diode.

We claim:

1. A bipolar heterojunction diode comprising:
   a blocking layer of a first conductivity type, the blocking layer having a first conduction band minimum that is less than a fermi level of the diode;
   a first junction region abutting the blocking layer, the first junction region having a second conduction band minimum that is less than the first conduction band maximum;
   a second junction region abutting the first junction region, the second junction region having a first valence band maximum is not less than the second conduction band minimum; and
   an anode of a second conductivity type, the anode abutting the second junction region and having a second valence band maximum that is greater than the fermi level.

2. The diode of claim 1 wherein the anode includes P-type aluminum antimonide and the blocking layer includes N-type aluminum antimonide.

3. The diode of claim 1 wherein the first junction region includes indium arsenide.

4. The diode of claim 1 wherein the second junction region includes gallium antimonide.

5. The diode of claim 1 wherein the second junction region is approximately 10 to 20 nanometers thick.

6. The diode of claim 1 wherein the anode includes P-type indium phosphide and the blocking layer includes N-type indium phosphide.

7. A semiconductor diode comprising:
   a blocking layer formed from a material having first conduction band minimum that is less than a fermi level of the diode;
   an anode having a first valence band maximum that is greater than the fermi level; and
   a junction region abutting the anode and the blocking layer, the junction region forming a heterojunction wherein a valence band of the junction region is not less than the first conduction band minimum.

8. The diode of claim 7 wherein the heterojunction is at an interface of the junction region with the blocking layer.

9. The diode of claim 8 wherein the blocking layer includes N-type indium arsenide, the junction region includes gallium antimonide, and the anode includes P-type aluminum antimonide.

10. The diode of claim 7 wherein the junction region includes a multilayer structure having a first portion abutting the blocking layer and a second portion abutting both the first portion and the anode, the second portion having the heterojunction.

11. The diode of claim 10 wherein the blocking layer includes N-type aluminum antimonide, the first portion includes indium arsenide, the second portion includes gallium antimonide, and the anode includes P-type aluminum antimonide.

* * * * *